(12) United States Patent
Freer et al.

(10) Patent No.: US 11,239,015 B2
(45) Date of Patent: *Feb. 1, 2022

(54) MAGNETIC CONTROLS FOR INDUSTRIAL ENCLOSURES

(71) Applicant: EATON INTELLIGENT POWER LIMITED, Dublin (IE)

(72) Inventors: Benjamin Avery Freer, Syracuse, NY (US); Stephan P. Iannce, Clay, NY (US); Joseph Michael Manahan, Manlius, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 304 days.

This patent is subject to a terminal disclaimer.

(21) Appl. No.: 16/429,867

(22) Filed: Jun. 3, 2019

(65) Prior Publication Data

US 2019/0304649 A1    Oct. 3, 2019

Related U.S. Application Data

(63) Continuation-in-part of application No. 15/271,855, filed on Sep. 21, 2016, now Pat. No. 10,312,908.

(Continued)

(51) Int. Cl.
*H01F 7/06* (2006.01)
*H05K 5/03* (2006.01)
*H05K 5/02* (2006.01)

(52) U.S. Cl.
CPC .......... *H01F 7/064* (2013.01); *H05K 5/0217* (2013.01); *H05K 5/03* (2013.01)

(58) Field of Classification Search
CPC ........ H01F 7/064; H05K 5/0217; H05K 5/03; G05G 9/047; G05G 2009/04755
See application file for complete search history.

(56) References Cited

U.S. PATENT DOCUMENTS

| 4,101,857 A | 7/1978 | O'Toole |
| 5,369,386 A | 11/1994 | Alden |

(Continued)

FOREIGN PATENT DOCUMENTS

| WO | WO1989004014 | 5/1989 |
| WO | WO2006107486 | 10/2006 |

OTHER PUBLICATIONS

International Search Report and Written Opinion for Application No. PCT/US2016/053551 dated Jan. 5, 2017, 17 pages.

*Primary Examiner* — Bernard Rojas
(74) *Attorney, Agent, or Firm* — Merchant & Gould P.C.

(57) ABSTRACT

A system comprises an industrial enclosure, first and second magnetic controls in close proximity to one another, and a magnetic field sensor. The first and second magnetic controls are secured to an outer surface of a cover of the industrial enclosure without penetrating an inner surface of the cover. The magnetic field sensor within the industrial enclosure senses a characteristic of the first magnetic control and a characteristic of the second magnetic control, and generates a signal corresponding to each of the characteristics. The signal is used by a controller to identify a setting of each of the first and second magnetic controls. Each of the first and second magnetic controls are positioned proximate to one another and each has a polarity and/or magnetic field strength that does not interfere with the detection of the others respective characteristic.

20 Claims, 7 Drawing Sheets

Related U.S. Application Data

(60) Provisional application No. 62/233,485, filed on Sep. 28, 2015.

(56) References Cited

U.S. PATENT DOCUMENTS

| | | |
|---|---|---|
| 5,581,179 A | 12/1996 | Engel et al. |
| 5,691,637 A | 11/1997 | Oswald et al. |
| 5,870,914 A | 2/1999 | Dawson |
| 6,201,388 B1 | 3/2001 | Pecheny et al. |
| 6,864,679 B2 | 3/2005 | Yokoji |
| 6,912,137 B2 | 6/2005 | Berghegger |
| RE40,523 E | 9/2008 | Miyata |
| 7,825,537 B2 | 11/2010 | Freer |
| 8,120,453 B2 | 2/2012 | Preaux |
| 8,222,889 B2 | 7/2012 | Oberhoffner |
| 8,971,072 B2 | 3/2015 | Calvin et al. |
| 9,086,740 B2 | 7/2015 | Furukawa |
| 9,214,304 B2 | 12/2015 | Matsumoto |
| 9,355,800 B2 | 5/2016 | Henderson |
| 9,728,358 B2 | 8/2017 | Henderson |
| 9,754,739 B2 | 9/2017 | Honda |
| 10,312,908 B2 | 6/2019 | Freer |
| 2004/0094393 A1 | 5/2004 | Lalonde et al. |
| 2005/0127902 A1 | 6/2005 | Sogge et al. |
| 2011/0120849 A1 | 5/2011 | Morimoto |
| 2012/0152381 A1 | 6/2012 | Ungerer et al. |
| 2012/0215475 A1 | 8/2012 | Rutledge et al. |
| 2012/0256821 A1 | 10/2012 | Olsson et al. |
| 2012/0274563 A1 | 11/2012 | Olsson |
| 2012/0287032 A1 | 11/2012 | Olssen |
| 2012/0306603 A1 | 12/2012 | Olsson et al. |
| 2013/0162268 A1 | 6/2013 | Pechstein et al. |
| 2014/0184367 A1 | 7/2014 | Liao |
| 2014/0232496 A1 | 8/2014 | Chang |
| 2014/0256188 A1 | 9/2014 | Manahan et al. |
| 2016/0003270 A1* | 1/2016 | Franklin ............... H01F 7/0221 439/529 |
| 2016/0077543 A1* | 3/2016 | Conro ................... G05G 9/047 74/471 XY |
| 2017/0094444 A1 | 3/2017 | Cameron |

* cited by examiner

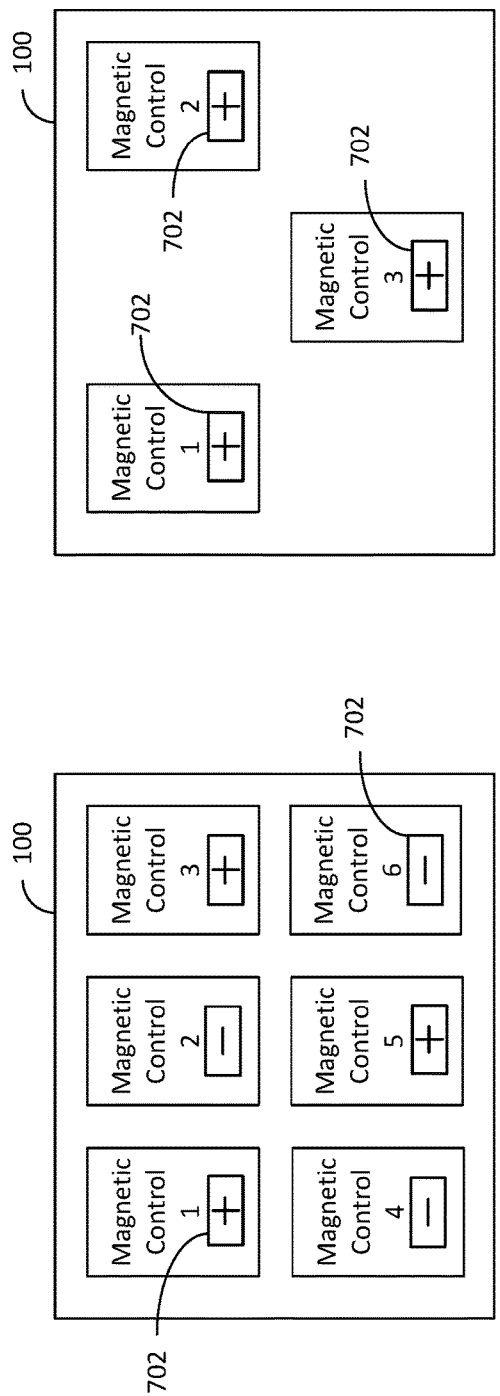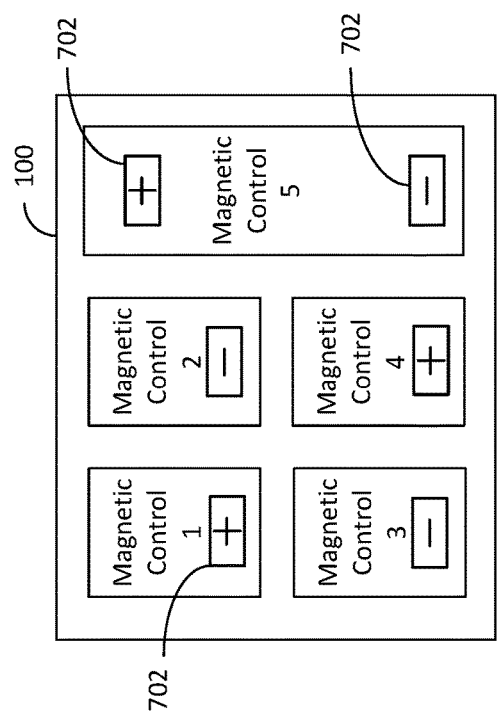

MAGNETIC CONTROLS FOR INDUSTRIAL ENCLOSURES

CLAIM TO PRIORITY

The present disclosure comprises a continuation-in-part of, and claims priority to, U.S. patent application Ser. No. 15/271,855, filed Sep. 21, 2016, now U.S. Pat. No. 10,312,908 which claims priority to U.S. Provisional Application No. 62/233,485, filed Sep. 28, 2015. The content of each of the two identified applications is hereby incorporated by reference in their entirety.

FIELD OF THE DISCLOSURE

The present disclosure generally relates to industrial enclosures and, more specifically, to the incorporation of magnetic controls in industrial enclosures.

BACKGROUND OF THE DISCLOSURE

Industrial control systems are an important and necessary element in automating machinery and processes in industrial applications worldwide. Industrial control systems implement mechanical, hydraulic, pneumatic, and electrical controls as well as provide a user with a means to interface with these controls. The types of user interfaces can vary from a simple pushbutton to complex, computerized touch screens. Regardless of the type of user interface, each user interface must be presented to the user in an enclosure that is suitable to the environment in which the interface operates. As such, significant engineering work goes into designing enclosures that are not only appropriate to house a user interface but are also cost-effective to manufacture and maintain. Another important consideration of enclosure design is how to fit as many controls as possible into the smallest footprint while providing desired operability.

The many and varied types of industrial environments present different types of hazards and concerns. A major safety concern in dust laden industrial plants is the occurrence of fires and explosions. A source of energy is all that is needed to ignite an explosion when flammable gases or combustible dusts are mixed in the proper proportions with air. That source of energy can come from any number of sources within a plant environment however one area of particular concern is the plant's electrical installation which might include electrical components such as switches, circuit breakers, motor starter, pushbutton stations, or plugs and receptacles.

As such, the National Electric Code (NEC) has worked to establish a classification system to classify hazardous locations and to define standards for the types of electrical equipment that may be allowed into the hazardous location. The classes define the type of explosive or ignitable substances which are present in the atmosphere. Class I locations, those locations of particular relevance to the present disclosure, are those in which flammable vapors and gases may be present. Class I is further subdivided into two divisions. Division 1 is a location in which ignitable concentrations of hazards exists under normal operation conditions and/or where hazard is caused by frequent maintenance or repair work or frequent equipment failure. Division 2 is a location in which ignitable concentrations of hazards are handled, processed or used, but which are normally in closed containers or closed systems from which they can only escape through accidental rupture or breakdown of such containers or systems.

With regard to the types of electrical equipment that may be allowed in a Class I, Division 1 or Division 2 location, the NEC noted that any type of conventional relay, contact, or switch that has an arcing contact must be enclosed in an explosion proof housing. The NEC has defined an Explosionproof Apparatus as an apparatus enclosed in a case that is capable of withstanding an explosion of a specified gas or a vapor that may occur within it and of preventing the ignition of a specified gas or vapor surrounding the enclosure by sparks, flashes, or explosion of the gas or vapor within, and that operates at such an external temperature that a surrounding flammable atmosphere will not be ignited thereby.

Thus, an explosion proof enclosure must prevent the ignition of an explosive gas or vapor that may surround it. In other words, an explosion inside the enclosure must be prevented from starting a larger explosion outside the enclosure. An explosion proof enclosure must further be of adequate strength and be "flame-tight." The term "flame-tight" does not imply that the enclosure is hermetically sealed but rather that the joints or flanges are held within narrow tolerances. These carefully machined joints cool the hot gases resulting from an internal explosion so that by the time they reach the outside hazardous atmosphere they are not hot enough to cause ignition.

Alternatively, intrinsically safe equipment may be used in a Class I, Division 1 or Division 2 location, wherein intrinsically safe equipment and wiring are incapable of releasing sufficient electrical or thermal energy under normal or abnormal conditions to cause ignition of a specific hazardous atmospheric mixture in its most easily ignited concentration.

The constraints around the types of enclosures that may be placed within a Class I, Division 1 or Division 2 location, must be addressed by the engineers designing and building the enclosure. Intrinsically safe barriers and complex flame paths require significant design and construction efforts at significant cost. Consequently, electrical control designs have focused on simplified push-buttons and simplified selector switches within explosion proof enclosures.

SUMMARY

An aspect of the disclosure is directed to a system that comprises an industrial enclosure, first and second magnetic controls in close proximity to one another, and one or more magnetic field sensors. The first and second magnetic controls are secured to an outer surface of a cover of the industrial enclosure without penetrating an inner surface of the cover. The one or more magnetic field sensors within the industrial enclosure sense a characteristic of the first magnetic control and a characteristic of the second magnetic control, and generate respective one or more signals corresponding to each of the characteristics. The one or more signals are used by a controller to identify a setting of each of the first and second magnetic controls. In certain embodiments, signals from a plurality of magnetic field sensors are used to isolate a response of a specific magnet and its associated magnet control. In certain embodiments, signals from a plurality of magnetic field sensors are used to triangulate a position of a specific magnet and its associated magnetic control. Each of the first and second magnetic controls are positioned proximate to one another and each has a polarity and/or magnetic field strength that does not interfere with the detection of the others respective characteristic.

Another aspect of the disclosure is directed to a system comprising an industrial enclosure, a plurality of magnetic controls that are within close proximity to one another, a magnetic field sensor and a controller. The industrial enclosure includes a cover having an outer surface and an inner surface opposite the outer surface. The plurality of magnetic controls are secured to the outer surface of the cover without penetrating the inner surface of the cover enabling the system to meet the standards for a Class I location as established by the National Electric Code (NEC). The magnetic field sensor is within the industrial enclosure and senses one or more characteristics for each of the plurality of magnetic controls. The magnetic field sensor generates a signal representative of the one or more characteristics for each one of the plurality of magnetic controls and transmits the signal to the controller. The controller uses the signal to identify each of the plurality of magnetic controls, for example, through signal isolation. The controller can additionally use the signal to determine a position of each of the magnetic controls, for example, through position triangulation wherein the position corresponds to a setting of the respective magnetic control. The one or more characteristics can comprises magnetic polarity associated with the respective magnetic control and a vector magnitude based on a magnetic field generated by the respective magnetic control.

Still another aspect of the present disclosure is directed to a system comprising an industrial enclosure a first rotatable magnetic control nested within a second rotatable magnetic control, a third magnetic control, one or more magnetic field sensors and a controller. The first rotatable magnetic control is nested within the second rotatable magnetic control, wherein both of the first and second rotatable magnetic controls rotate about a common central axis. The first and second rotatable magnet controls, as well as the third magnetic control, are secured to a cover of the industrial enclosure without penetrating an inner surface of the cover. The second rotatable magnetic control is rotatable to select a first operating parameter and first rotatable magnetic control is rotatable to select a second operating parameter associated with the first operating parameter. The third magnetic control activates/deactivates a third operating parameter that may be distinct from, or associated with, the first and/or second operating parameter. The one or more sensors sense one or more characteristics from the each of the first and second rotatable magnetic controls and the third magnetic control, and generates, for each control device, a signal representative of the one or more characteristics. The controller receives the signals to identify each of the control devices, their respective positions and corresponding operating parameters.

The above summary is not intended to describe each embodiment or every implementation. A more complete understanding will become apparent and appreciated by referring to the following detailed description and claims in conjunction with the accompanying drawings.

DESCRIPTION OF THE DRAWINGS

FIGS. 7A-7C are simplified block diagrams illustrating various example configurations of a plurality of magnetic controls that can be implemented with an industrial enclosure.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

One aspect of the present disclosure is directed to nested, magnetic controls that may be implemented in an industrial enclosure. The nested, magnetic controls provide multi-functional operation in a small foot print. When used with an explosion proof enclosure, within a Class I, Division 1 or Division 2 location, the nested, magnetic controls are able to provide significantly more functionality than the simplified, mechanical push-buttons and selector switches currently available for these locations. The multi-functional ability of the nested, magnetic controls increases the usability of the control interface yet requires little modification to the design of the enclosure in which they are implemented. It should be noted that, while the description below refers to example configurations comprising explosion proof enclosures, the nested, magnetic controls of the present disclosure may be implemented within any type of suitable industrial enclosure.

Figure 1:
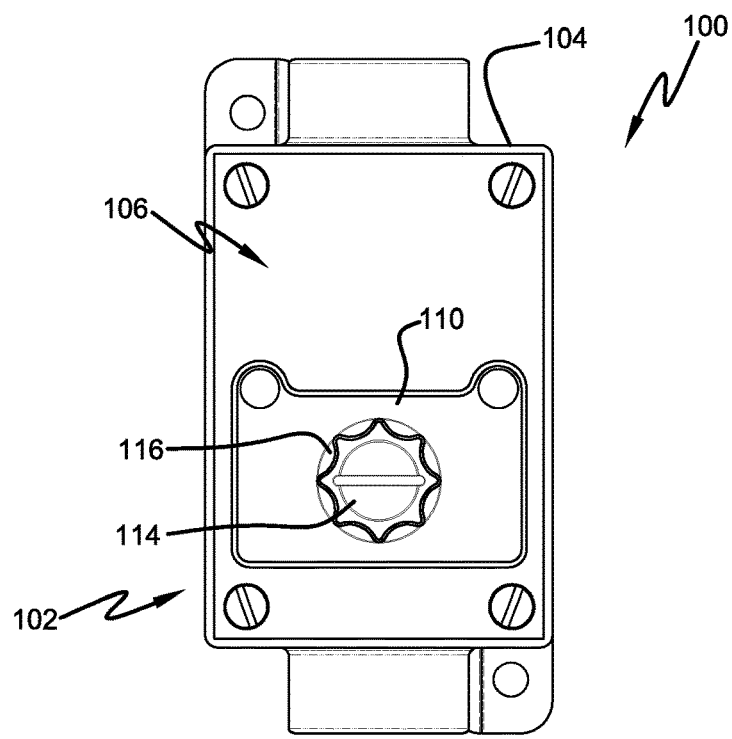
FIG. 1 is a perspective view of an industrial enclosure equipped with nested, magnetic controls according to various embodiments of the disclosure.
Figures 2, 3:
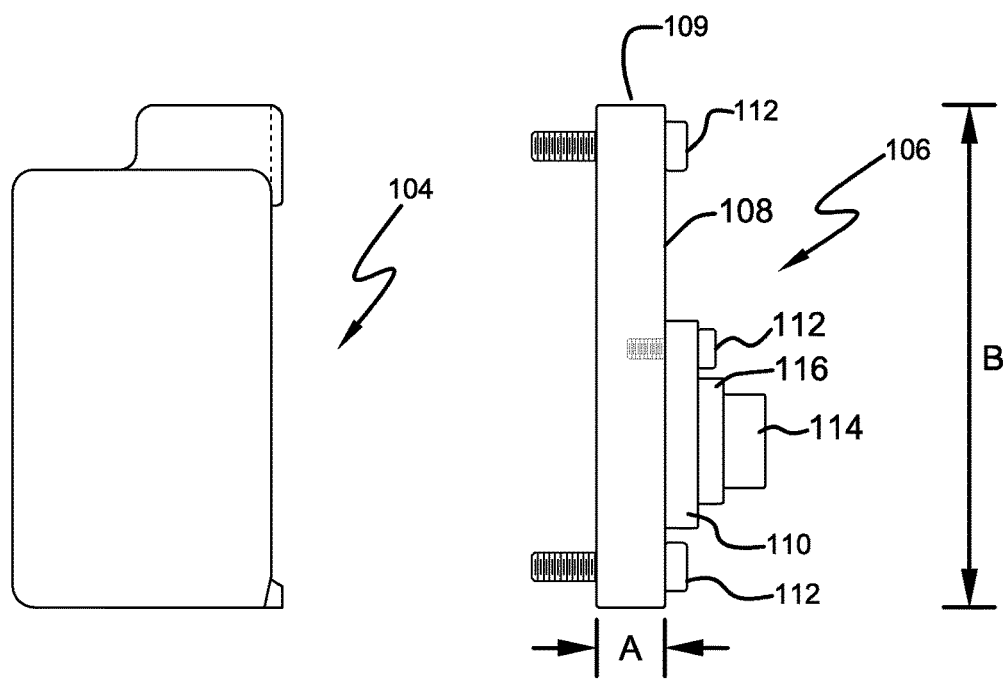
FIG. 2 is a side view of the body of the industrial enclosure of FIG. 1.
FIG. 3 is a side view of the cover of the industrial enclosure of FIG. 1.

Referring to FIG. 1 an industrial enclosure 100 is equipped with nested, magnetic controls 102 is illustrated. A side view of the body 104 of the industrial enclosure 100 is illustrated in FIG. 2. In one example embodiment, the body 104 of the industrial enclosure 100 may comprise a commercially available body such as those provided with the explosion proof EDS/EFS Series Control Stations available from Crouse-Hinds which are typically made of a FERALOY® iron alloy or a copper-free aluminum. The body 104 of the industrial enclosure 100 may vary in size as appropriate to the application. However, by way of example with reference to the EDS/EFS bodies, the dimensions of the body 104 of the enclosure 100 are approximately six inches in height by three and a-half inches in width and two to three inches in depth.

The cover 106 of the industrial enclosure 100 comprises a face plate 108 and a flange 109, where the cover 106 has a depth A, a height B, and width C (see, FIG. 1) that is configured to interface with the body 104 of the enclosure; a side view of the cover 106 is illustrated in FIG. 3. A mounting plate 110, to which the nested, magnetic controls 102 are secured, is attached to the cover 106. The nested, magnetic controls 102 may be secured to the mounting plate 110 with a series of bolts (not shown) threaded into the cover, or through another appropriate mechanical means.

Notably, the mounting plate 110 and the nested, magnetic controls 102 are secured to the industrial enclosure 100 without penetrating the interior walls of the enclosure. In an example where the industrial enclosure 100 is an explosion proof enclosure, the absence of penetration means that no additional design considerations must be given to flame paths. In the conventional design of explosion proof enclosures, all penetrations through the enclosure are considered flame paths. This includes the threads within the cover for the device, and the orifices in the devices for the actuations of shaft assemblies, etc., and even the hubs for connection of electrical conduit. The present design eliminates the flame paths between the enclosure and cover, and within the enclosure, improving safety, ingress protection, and reliability in hazardous environments.

In one example embodiment, the face plate 108 and mounting plate 110 are fabricated from a copper-free aluminum while the screws 112 connecting the cover 106 to the body 104, and connecting the mounting plate 110 to the cover 106, are stainless steel. In another example embodiment, that of an explosion proof enclosure, the body 104 and the cover 106 each include accurately ground wide flanges for a flame-tight joint.

Figure 4:
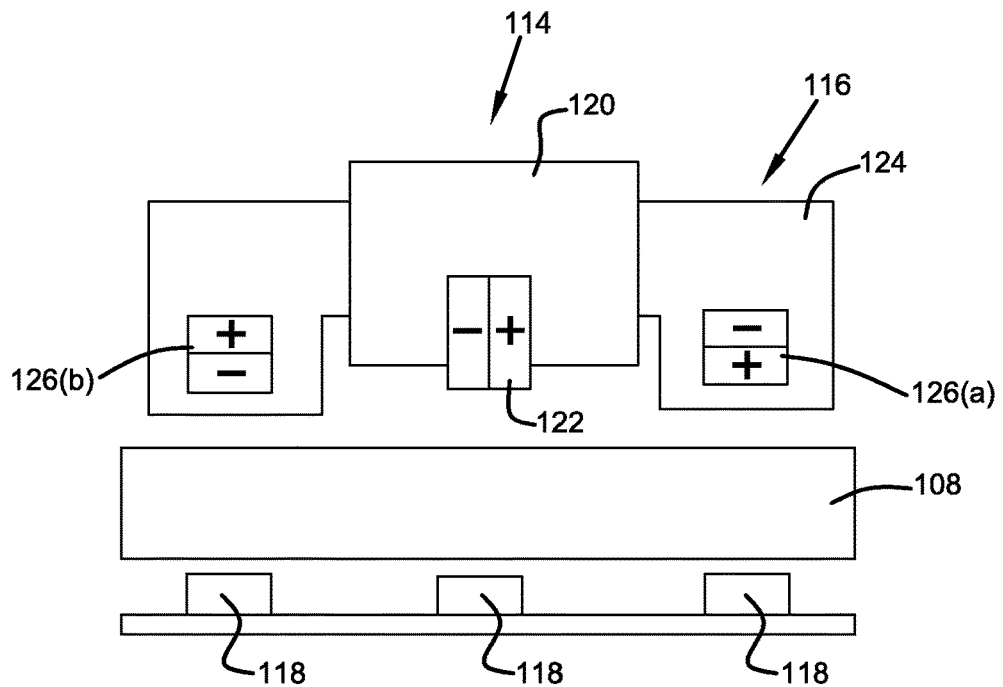
FIG. 4 is a simplified schematic cross section of the nested, magnetic controls of FIG. 1.

A cross section of the nested, magnetic controls 102, relative to the cover 106, is provided in FIG. 4. As shown, the nested, magnetic controls 102 generally comprise a magnetized inner dial 114 nested within a magnetized outer dial 116 and a plurality of sensors 118. The magnetized inner dial 114 comprises a rotatable housing 120 including a diametric cylindrical magnet 122 polarized with a positive (+) and negative (−) side as shown. The magnetized inner dial 114 is configured with a continuous 360 deg. rotational ability and essentially functions as a magnetized potentiometer. In alternative embodiments, the rotatable inner dial 114 may be replaced with a key switch, a push button (a "plunging" control), joystick, or combination there, e.g., a rotatable control that may be pushed down whereby any appropriate inner control (magnetic or non-magnetic) is surrounded by an outer rotatable magnetic control, e.g., magnetized outer dial 116.

The magnetized outer dial 116 comprises a rotatable housing 124 having an outer concentric configuration relative to the magnetized inner dial 114. The rotatable housing 124 includes two axially magnetized magnets 126a and 126b having opposite positive (+) and negative (−) polarization as shown. The magnets 126a and 126b are placed opposite one another within the housing 124. In one example embodiment, the magnetized outer dial 116 is configured as a selector switch having eight detent enabled positions. Other configurations of the outer magnetized dial 116, such as continuous 360 degree rotation, greater or lesser number of detents, etc., are also deemed part of the present disclosure. Further, in an alternative embodiment, the sensors 118 configured within the dials 114, 166 while the magnets 122, 126a, 126b are in a fixed position below the sensors 118. The magnets 122, 126a, and 126b, may comprise, but are not limited to rare earth magnets of Neodymium, Iron and Boron. The magnets 122, 126a, 126b, may further include coatings to protect them from the environment. Such coatings may include nickel, copper, tin, zinc, epoxy, silver, gold, or rubber.

Figure 5:
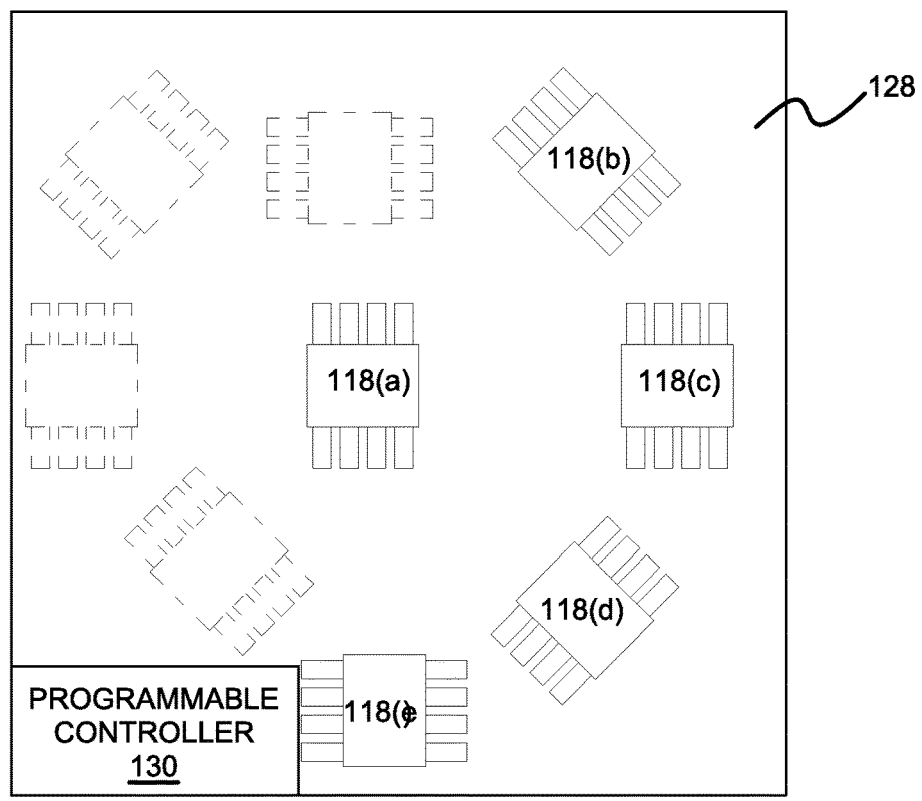
FIG. 5 illustrates an example of a circuit board configured to interface with the nested, magnetic controls of FIG. 1.

The sensors 118 are each configured to detect magnetic flux density along three axes, e.g., x-axis, y-axis, and z-axis. In an example embodiment, each of the sensors 118 comprises a TRIAXIS® Magnetometer IC (integrated circuit), e.g., MLX90363, available from Melexis. Suitable to the eight detent switch configuration described above, at least five sensors 118(a)-118(e) are provided and are arranged in a substantially radial configuration as shown in FIG. 5. In one example embodiment, the sensors 118(a)-118(e) are mounted to a circuit board 128 that is positioned within the flange 109 depth of the cover 106 such that sensor 118(a) is behind the cover 106 and beneath the magnetized inner dial 114. Similarly, positioning the circuit board 128 within the flange 109 of the cover 106 places sensors 118(b)-118(e) behind the cover 106 such that they may lie beneath magnets 126(a) and 126(b) of the magnetized outer dial 116. The circuit board 128 is additionally provided with a programmable controller 130, e.g., processor, microprocessor, FPGA (field programmable gate array) that is configured to operate on the output signals provided by each of the sensors 118(a)-118(e). The circuit board 128 is powered by a low system voltage (not shown).

Notably, only four radially positioned sensors 118(b)-118(e) are necessary for an eight detent position switch as, no matter the switch position, at least one of the magnets 126(a) or 126(b) will be positioned over one of the sensors 118(b)-118(e). Note that the opposite polarity of magnets 126(a) and 126(b) enables one to determine which hemisphere of the magnetic outer dial 116 is over each of the sensors 118(b)-118(e). Of course, a greater number of radially positioned sensors 118 could be used, if desired, at increased cost. When configuring other types of rotatable switches, a lesser or greater number of sensors 118 may be used as appropriate. Further, the switches may include additional positions, which may require additional magnets. Of note is that the number of sensors is substantially less than the number of positions by arrangement of the magnets.

Figure 6:
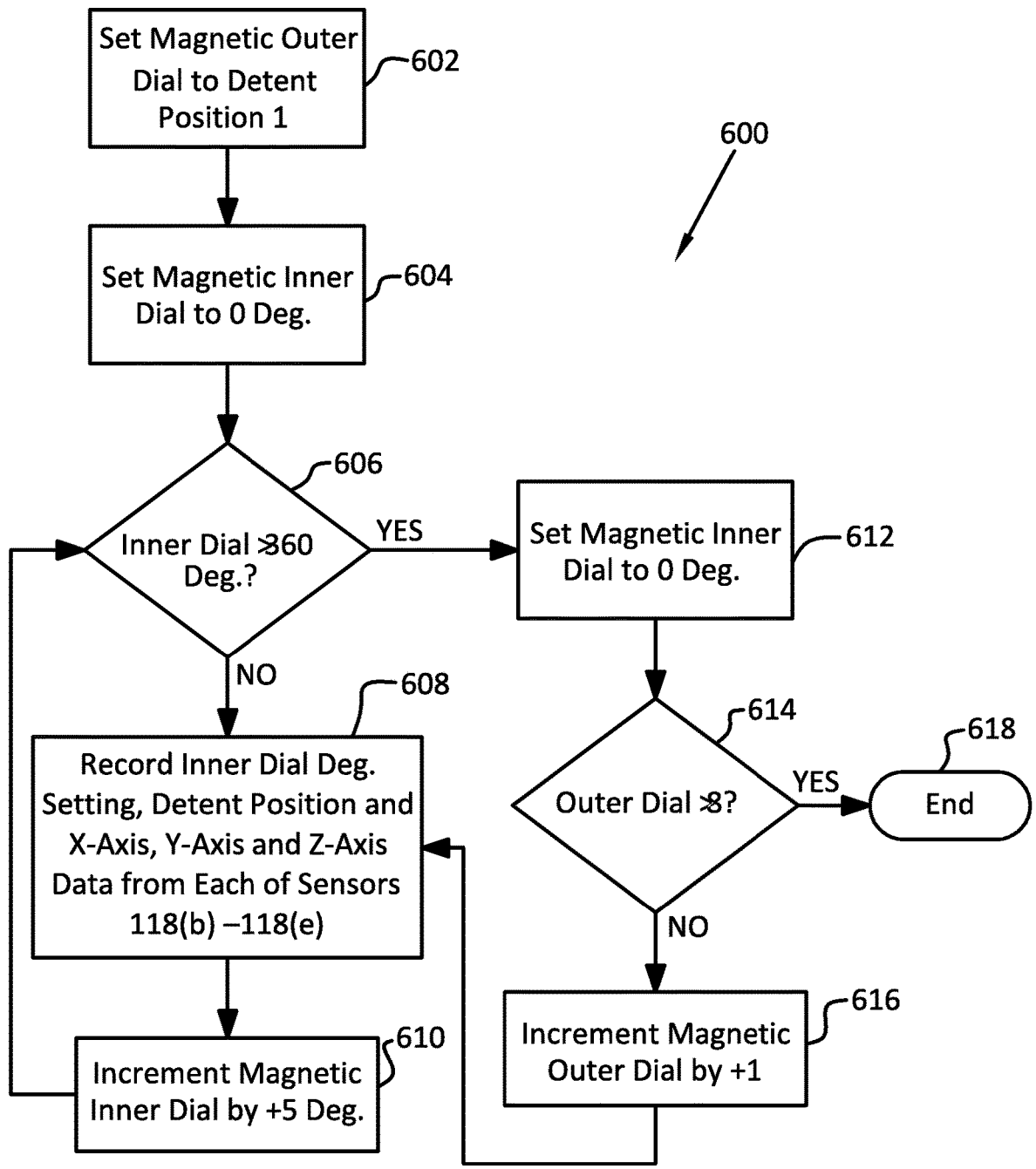
FIG. 6 is a flow chart illustrating an example calibration method for the nested, magnetic controls of FIG. 1.

To use the nested, magnetic controls 102 within the industrial enclosure 100 as described above, the controls 102 must first be calibrated with the knowledge that the close positioning of the magnets 122, 126(a) and 126(b) may create magnetic flux density interference. In an example embodiment, the magnetic interference issue may be dealt with by a data point calibration method 600 illustrated in FIG. 6.

The calibration 600 begins by setting the magnetic outer dial 116 to detent position 1 602 and the magnetic inner dial 114 to 0 deg. 604. A query 606 determines if the magnetic inner dial is at a position greater than 360 deg. If not, the position of the magnetic inner dial 114, the detent position of the magnetic outer dial 116, as well as the x-axis, y-axis, and z-axis outputs from each of the sensors 118(d) and 118(e) is recorded 606 in a data table within programmable controller 130. Subsequently, the degree setting of the magnetic inner dial 114 is increased by +5 deg., 610, and control is returned to query 606.

If query 606 determines that the degree reading of the magnetic inner dial 114 has surpassed 360 deg., then the position/value of the magnetic inner dial is reset to 0 deg. 612. Subsequently, query 614 determines if the magnetic outer dial detent setting has surpassed a value of 8. If not, the magnetic outer dial detent setting is increased by one 616 and data related to the inner dial degree setting, the outer dial detent setting, as well as the x-axis, y-axis, and z-axis outputs from each of the sensors 118(d) and 118(e) is recorded 608. If the query 614 has determined that magnetic outer dial detent setting has surpassed 8, all desired calibration data has been recorded and the calibration process is ended 618.

In one example embodiment, 576 data points are collected that account for measurements at every five degrees for all eight positions of the outer dial 116, e.g., 72*8=576. Each "data point" actually consists of x, y, and z measurement for the four sensors 118(b)-118(e), providing a total of 6912 pieces of data that may be used in the calibration.

In use the magnetic inner dial 114 may be used to change a setting value while the magnetic outer dial 116, having eight detent positions, may use one or all eight detent positions to select the setting to change. During run-time of the nested, magnetic controls 102, the programmable controller 130 is configured to perform a look-up in the data from the four sensors. A mean squared error calculation is performed by the programmable controller 130 from the sensor reading for all eight detent positions. The position with the lowest means squared error is considered to be the detent position of the magnetic outer dial 116.

More specifically, the inner dial 114 value is used as an input to a lookup table. The output of the lookup table is a data set consisting of x, y, and z values for all four sensors 118(b)-118(e), for all eight possible sensor positions (96 total values). Note that because the angle of the internal dial 114 affects the values read at the sensors 118(b)-1118(e), the values for the eight possible sensor positions in each of the 5 degree increments of the inner dial 114 are stored. The current values that are being measured are the x, y, and z for the four sensors 118(b)-118(e). The current x of each sensor is compared to the x of the corresponding sensor from the data set (for the current inner dial position), which gives 32 different error values (4 sensors times 8 positions). The same operation is performed on y and z, for a total of 96 error values. The 12 error values per outer dial position (x, y, and z, for sensors 118(b)-118(e)) are each squared, and an average is taken, resulting in a single positive value per outer dial position. The position that has the lowest error value is selected as the current position.

An example equation for calculating the mean squared error for an x-axis reading is provided below in Equation (1). Similar equations are used for y and z readings.

$$MSE = \frac{1}{n}\sum_{i=1}^{n}(x_i - \tilde{x}_i)^2 \qquad \text{Eq. (1)}$$

Where:

$n$ = the number $y$ data points $x_i = \begin{vmatrix} x_i \\ y_i \\ z_i \end{vmatrix}$ (The value read by sensor $i$)

$\tilde{x}_i = \begin{vmatrix} \tilde{x}_i \\ \tilde{y}_i \\ \tilde{z}_i \end{vmatrix}$ (The stored values for sensor $i$)

Once the detent position of the magnetic outer dial 116 is determined the operation assigned to the detent position may be activated/initiated by an output from the controller 130.

Of course different calibration methods and different run-time switch position determination methods that are known to those in the art, e.g., neural nets, baeysian classifiers, etc., may be used in place of the above-described data point calibration method and mean squared error switch position determination method, and are deemed part of the present disclosure.

The above-described nested, magnetic controls for an industrial enclosure provide the user with multi-functional controls in a small footprint. With regard to explosion proof industrial enclosures, the nested magnetic controls provide significantly more and complex interface options than has previously been available in Class I, Division 1 and Division 2 locations. Numbers of explosion proof enclosures utilizing simplified, one-action (e.g., push button, rocker switch) controls may now be replaced with a single explosion proof enclosure incorporating nested, magnetic controls.

Referring to FIGS. 7A-7C, the use of a plurality of magnetic controls in conjunction with an industrial enclosure, e.g., explosion proof industrial enclosure 100, is not limited to the nested magnetic controls described herein. Rather, it will be appreciated that a plurality of magnetic controls in various forms (e.g., push button, push-plunger, switch, rocker switch, selector switch, lever, dial, nested dials (a plurality of dials rotatable about a central axis), lights, etc.) can be implemented at an industrial enclosure in close proximity to one another without penetrating the interior walls of the industrial enclosure. Two or more magnetic controls are in close proximity when the placement of one magnetic control, and its respective magnetic field, does not interfere with the detectability of a second (or third, fourth, fifth, . . . ) proximate magnetic control and its respective magnetic field. FIGS. 7A-7C illustrate various example configurations of the industrial enclosure 100 with a plurality of magnetic controls.

Specifically, FIG. 7A illustrates the industrial enclosure 100 having six magnetic controls (1-6) each with a single magnet 702 having a positive or negative polarity. FIG. 7B illustrates the industrial enclosure 100 with three magnetic controls (1-3) each with a single magnet 702 having a positive polarity. FIG. 7C illustrates the industrial enclosure 100 with five magnetic controls (1-5) with each of magnetic controls 1-4 having a single magnet 702 of a positive or negative polarity and magnetic control 5 having two magnets 702 one with a positive polarity and one with a negative polarity. Numerous other configurations of magnetic controls implemented with the industrial enclosure 100 are also possible as can appreciated by those skilled in the art including various magnetic controls that utilize a single magnet or a plurality of magnets.

The possible proximity of magnetic controls is a function of the polarity and magnetic field strength of each magnet utilized within the magnetic control. For example, two magnetic controls having corresponding magnets of the same polarity and magnetic field strength will need to be separated by a greater distance, due to the possibility of interference in detectability of one or both the of the corresponding magnets. In another example, two magnetic controls having corresponding magnets with dissimilar polarity and/or dissimilar magnetic field strength can be closely positioned, e.g. nearly touching, because the polarity and magnetic fields of each of the magnets of the respective magnetic control will not interfere with the detection of the other of the magnets and its respective magnetic control. As such, consideration of polarity and magnetic field strength must be considered in laying out the placement of a plurality of magnetic controls on a single enclosure.

When the layout of magnetic controls for a single enclosure is complete each magnetic control includes one or more magnets that are usable to differentiate one magnetic control from another based on the characteristics of the respective magnets. Each magnetic control (e.g., push button, push-plunger, switch, rocker switch, selector switch, lever, dial, nested dials, lights etc.) includes one or more magnets whose polarity and vector magnitude (based on the magnetic field generated by the one or more magnets) are detectable by one or more sensors (e.g. Hall sensors or other magnetic field sensors) within the industrial enclosure. The signal generated by the one or more sensors are transmitted to a controller within the industrial enclosure (or external to the industrial enclosure) wherein programming of the controller is utilized to identify the respective magnetic control, its respective position and corresponding setting based on the signal. For example, the signals generated by the one or more sensors can be used to isolate a specific magnet and its corresponding magnetic control, position and/or setting. In another example, the signals generated by the one or more sensors can be used to triangulate the position of a specific magnet and its corresponding magnetic control, position and/or setting. In certain examples, the signals generated by the one or more sensors enable the controller to determine a polarity and vector magnitude of each magnetic control. In certain examples, programming of the controller filters the signal from the one or more sensors to removes noise on the signal.

Figure 8:
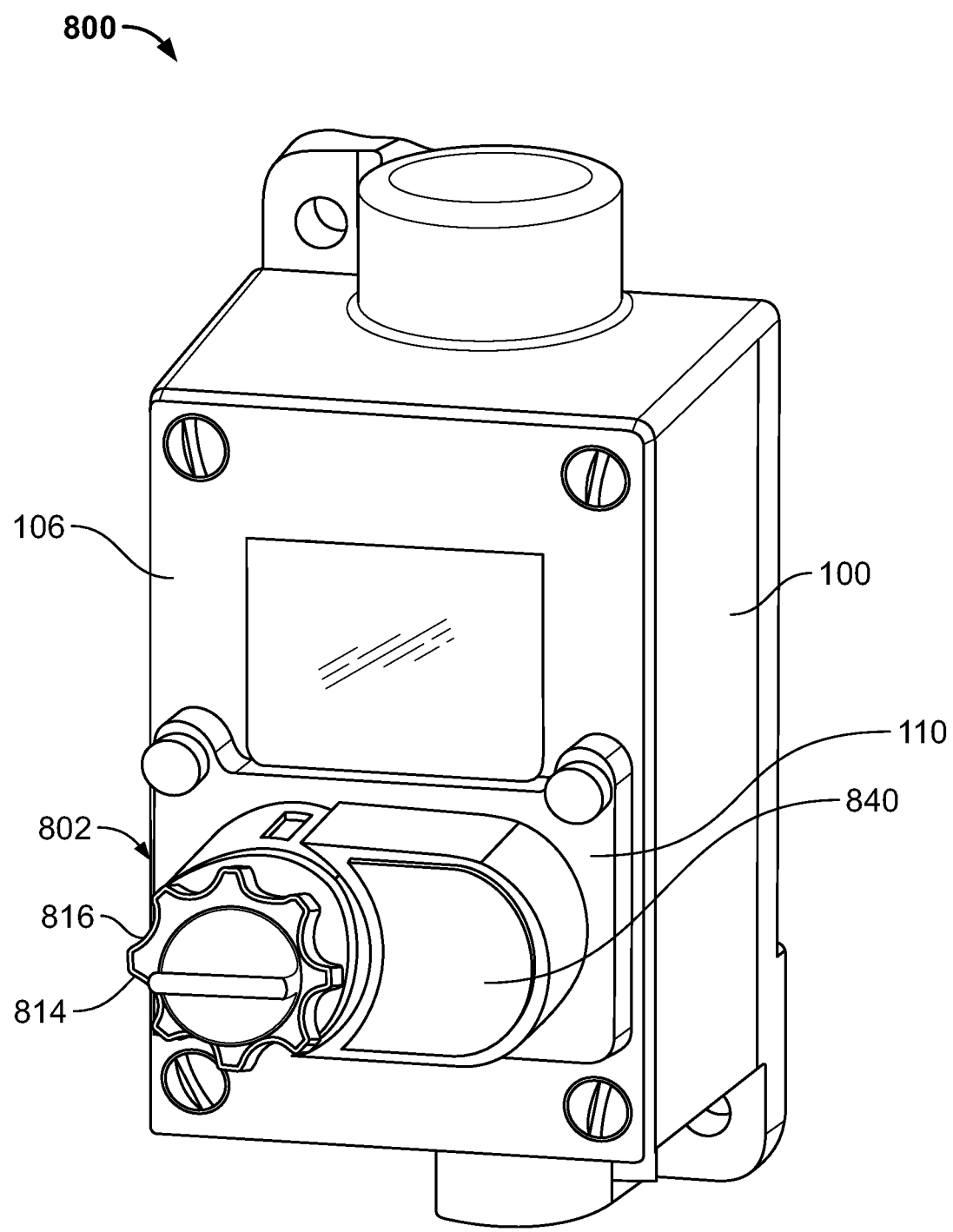
FIG. 8 is a perspective view of an industrial enclosure equipped with magnetic controls according to various embodiments of the disclosure.
Figure 9:
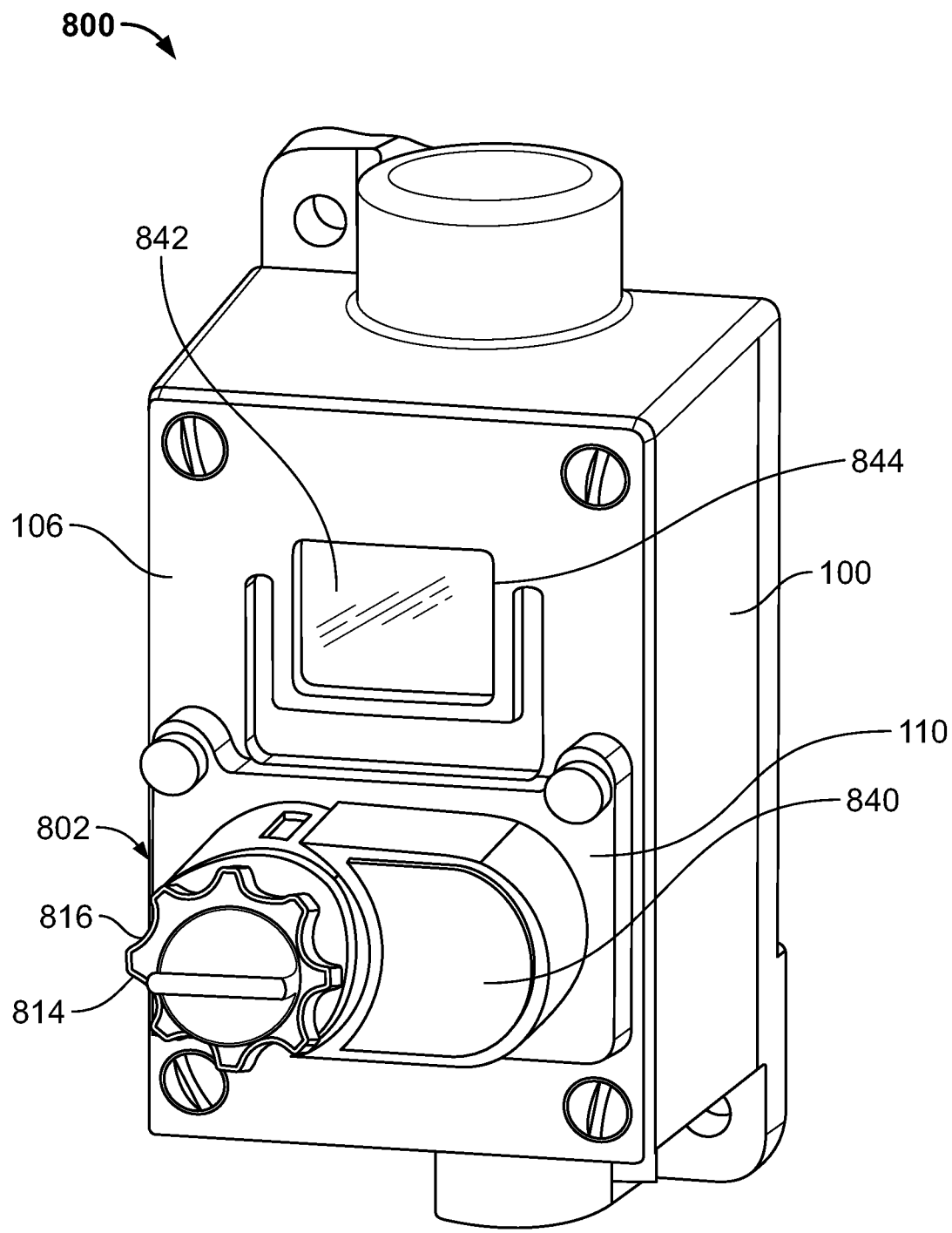
FIG. 9 is a perspective view of an industrial enclosure equipped with magnetic controls and a display screen according to various embodiments of the disclosure.
Figure 10:
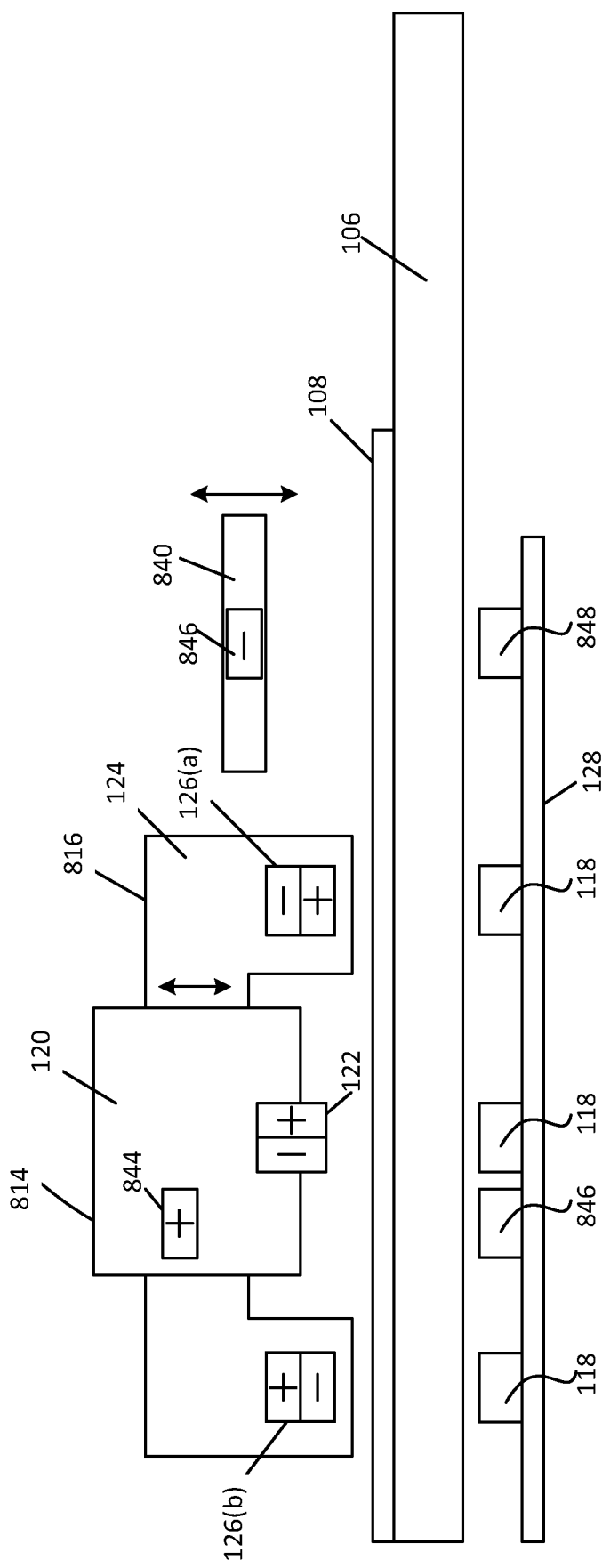
FIG. 10 is a simplified schematic cross section of the magnetic controls of FIGS. 8 and 9.

FIGS. 8-10 illustrate the nested magnetic controls of FIGS. 1-6 enhanced with additional magnetic controls, e.g., a push-plunger magnetic control and a push button magnetic control. As shown in FIG. 8, the industrial enclosure 100 is equipped with nested magnetic controls 802, which include a magnetized push-plunger inner dial 814 and magnetized outer dial 816 that are rotatable about a common central axis, as well as a push button 840. The nested magnetic controls 802 and push button 840 are secured to mounting plate 110 while mounting plate 110 is attached to the cover 106 of the industrial enclosure 100. The mounting plate 110, nested magnetic controls 802 and push button 840 are secured to the industrial enclosure 100 without penetrating the interior walls of the industrial enclosure 100.

FIG. 9 illustrates that the industrial enclosure 100 can additionally include a display screen 842 that is visible, via a window 844, through the cover 106 of the industrial enclosure 100 while maintaining the explosion proof classification of the industrial enclosure 100. In certain example embodiments, the display screen 842 is in communication with a controller, e.g., controller 130 of FIG. 5, that is within (or external to) the industrial enclosure 100. Items displayed on the display screen 842 can include, but are not limited to, static or dynamic, adjustable or non-adjustable: operational parameters, calibration parameters or program listings associated with one or more of the magnetic controls of the industrial enclosure or associated with one or more controls, components or systems beyond the confines of the industrial enclosure 100. In certain example configurations, the display screen 842 displays the settings associated with one or more positions of the inner dial 814 and/or the outer dial 816, and updates to reflect the current settings of one or both of dials 814, 816.

In certain example embodiments, the construction of the display screen 842 enables the reduction or elimination of internal pressure within the industrial enclosure 100. More specifically, the display screen 842 can include an embedded controller/control module that contains no moving parts; all moving controls are on the outside of the industrial enclosure 100 with no penetration to the interior of the industrial enclosure 100. As such, the electronics of the display screen 842 including the controller/control module can be encapsulated. The encapsulation provides hazardous area protection that enables the electronics to be housed in a sheetmetal or polymer enclosure in Class I, Div 2 locations or IEC Zone 1 or 2 applications for example, but can also be used to effectively limit the internal volume of the Class I, Div 1 enclosure which as a result can limit the pressure that would be created from an explosion. Similarly, all of the electronics within the industrial enclosure 100, including the display screen 842, can be encapsulated to the cover 106 and window 844 thereby limiting the transfer of pressure to the window 844 directly while enabling a larger window to be used.

Referring to FIG. 10, providing a simplified schematic of the magnetic controls of FIGS. 8 and 9, the inner dial 814 of the nested magnetic controls 802 incorporates the functionality and elements of magnetized inner dial 114 including a rotatable housing 120 having a diametric cylindrical magnet 122 that is polarized with a positive (+) and negative (−) side and 360 deg. rotational ability. The inner dial 814 additionally includes a push-plunger functionality as indicated by the up/down arrow as illustrated. For example, a user can rotate the inner dial 814 to a desired position then depress/"push" the inner dial 814 providing an indication to the controller 130 that a functionality associated with the current desired position of the inner dial 814 should be activated.

In certain example configurations, the inner dial 814 includes a magnet 844 having a polarity and vector magnitude that is different from that provided by diametric cylindrical magnet 122. The polarity and vector magnitude of magnet 844 is detectable by a sensor 846 (e.g., a Hall effect sensor or other magnetic field sensor) within the industrial enclosure 100 to generate and transmit a signal to the controller 130 (see FIG. 5) thereby providing the indication. As such, the indication by the push-plunger of the desired position of the inner dial 814 locks in the setting of inner dial 814. Accordingly, subsequent stray magnetic fields or subsequent unintended rotation of the inner dial 814 will not alter the setting of the inner dial 814, e.g., the setting of the inner dial will remain constant until the inner dial 814 is once again depressed. In certain example embodiments, the vector magnitude is determined by measuring the x, y and z forces (e.g., $x^2+y^2=z^2$) of the magnetic field generated by each of the magnets. A change in direction of a magnet, e.g., magnet 844, can be inferred from the changes in force of the magnet.

The outer dial 816 of the nested magnetic controls 802 incorporates the functionality and elements of magnetized outer dial 116 including a rotatable housing 124 (e.g., continuous rotation 360 deg. rotation or having defined détente positions) that includes two axially magnetized magnets 126a, 126b having opposite positive (+) and negative (−) polarization as shown.

The outer dial 816 of the nested magnetic controls 802 works in conjunction with push button 840. For example, a user can rotate the outer dial 816 to a desired position and then depress push button 840 providing an indication to the controller 130 that a functionality or operation associated with the current desired position of the outer dial 814 should be activated. In certain example configurations, the push button 840 includes a magnet 846 having a polarity and vector magnitude that is different from the axially magnetized magnets 126a, 126b of the outer dial 816. The polarity and vector magnitude of magnet 846 is detectable by a sensor 848 (e.g., a Hall effect sensor or other magnetic field sensor) within the industrial enclosure 100 to generate and transmit a signal to the controller 130 (see FIG. 5) thereby providing the indication. As such, the indication generated via the push button 840 of the desired position of the outer dial 816 locks in the setting of outer dial 816. Accordingly, subsequent stray magnetic fields or subsequent unintended rotation of the outer dial 816 will not alter the setting of the outer dial 816, e.g., the setting of the outer dial 816 will remain constant until the push button 840 is once again depressed providing a new position indication, and a corresponding setting, at the controller 130.

In certain example configurations, differing functionalities are applied to the nested magnetic controls 802 and push button 840. For example, the outer dial 816 can be used to select among a plurality of motors (or loads) to control while the inner dial 814 provides a speed adjustment from 0-100% of full speed of the selected motor. The push-plunger functionality of the inner dial 814 can be used as an on/off switch for the selected motor rather that a confirmation of setting of the inner dial 814 as described above. In another example, the outer dial 816 can be used to move between modes to display on the display screen 842 sensor values while the inner dial 814 and push-plunger functionality of the inner dial 814 are used to set-up threshold values for various parameters being monitored in the different modes. Numerous other functionalities can be implemented with the nested magnetic controls 802, push button 840 or a combination of other magnetic controls as will be appreciated by one skilled in the art.

Systems, devices or methods disclosed herein may include one or more of the features, structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality.

Various modifications and additions can be made to the disclosed embodiments discussed above. Accordingly, the scope of the present disclosure should not be limited by the particular embodiments described above, but should be defined only by the claims set forth below and equivalents thereof.

What is claimed:

1. A system comprising:
   an industrial enclosure having a cover with an outer surface and an inner surface opposite the outer surface;
   a first magnetic control including a first magnet;
   a second magnetic control including a second magnet, wherein the second magnetic control is proximate the first magnetic control, and wherein the first and second magnetic controls are secured to the outer surface of the cover without penetrating the inner surface of the cover; and
   one or more magnetic field sensors within the industrial enclosure, wherein the one or more magnetic field sensors sense a characteristic of the first magnet to identify a setting of the first magnetic control, and wherein the one or more magnetic field sensors sense a characteristic of the second magnet, which is different from the characteristic of the first magnet, to identify a setting of the second magnetic control,
   wherein the first and second magnetic controls are positioned proximate one another such that the first magnet of the first magnetic control does not interfere with the sensing of the characteristic of the second magnet and such that the second magnet of the second magnetic control does not interfere with the sensing of the characteristic of the first magnet.

2. The system of claim 1, wherein the characteristic of the first and second magnets comprises a vector magnitude.

3. The system of claim 2, wherein the characteristic of the first and second magnets further comprises a polarity.

4. The system of claim 1, wherein the first magnetic control and the second magnetic control each comprise one of: a push button, a push-plunger, a switch, a rocker switch, a selector switch, a lever, a dial, nested dials, and a light.

5. The system of claim 1, wherein the industrial enclosure is configured for use in hazardous environments.

6. The system of claim 1, wherein the one or more magnetic field sensors comprise at least a first magnetic field sensor to identify the first magnetic control and second magnetic field sensor to identify the second magnetic control.

7. The system of claim 1, further comprising a controller within the industrial enclosure, wherein the controller is in communication with the one or more magnetic field sensors.

8. The system of claim 1, further comprising a display device within the industrial enclosure, wherein the display device is visible through the cover of the industrial enclosure.

9. The system of claim 8, wherein the display device displays a setting corresponding to one or both of the first magnetic control and the second magnetic control.

10. The system of claim 1, wherein the second magnetic control controls a parameter associated with a setting of the first magnetic control.

11. A system comprising:
    an industrial enclosure having a cover with an outer surface and an inner surface opposite the outer surface;
    a plurality of magnetic controls within close proximity of one another, wherein the plurality of magnetic controls are secured to the outer surface of the cover without penetrating the inner surface of the cover;
    one or more magnetic field sensors within the industrial enclosure, wherein the one or more magnetic field sensors sense one or more characteristics of each of the plurality of magnetic controls and generate one or more signals representative of the sensed one or more characteristics of each of the plurality of magnetic controls; and
    a controller, wherein the controller receives the one or more signals representative of the sensed one or more characteristics of each of the plurality of controls and identifies each of the plurality of magnetic controls based on the received signal,
    wherein each of the plurality of magnetic controls includes a respective magnet and wherein the plurality of magnetic controls are positioned in close proximity to one another such that the respective magnet of each of the plurality of magnetic controls control does not interfere with the sensing of the one or more characteristics of each of the respective magnets of the other of the plurality of magnetic controls.

12. The system of claim 11, where in the controller additionally determines a position of each of the plurality of magnetic controls based on the received signal and wherein the position corresponds to a setting of the respective magnetic control.

13. The system of claim 11, wherein the one or more characteristics comprises a polarity and a vector magnitude.

14. The system of claim 11, wherein the one or more magnetic field sensors comprise a plurality of magnetic field sensors.

15. The system of claim 14, wherein the plurality of magnetic field sensors comprise at least one magnetic field sensor for each one of the plurality of magnetic controls.

16. The system of claim 11, wherein the plurality of magnetic controls are selected from a push button, a push-plunger, a switch, a rocker switch, a selector switch, a lever, a dial, nested dials, and a light.

17. The system of claim 11, further comprising a display device within the industrial enclosure, wherein the display device is visible through the cover of the industrial enclosure.

18. The system of claim 17, wherein the display device displays a setting corresponding to one or more of the plurality of magnetic controls.

19. The system of claim 11, wherein the industrial enclosure meets the standards required for use in a Class I location as defined the National Electric Code (NEC).

20. A system comprising:
- an industrial enclosure having a cover with an outer surface and an inner surface opposite the outer surface;
- a first rotatable magnetic control nested within a second rotatable magnetic control, wherein each of the first and second rotatable magnetic controls rotate about a common central axis,
- wherein the first rotatable magnetic control is rotatable to select a first operating parameter and the second rotatable magnetic control is rotatable to select a second operating parameter that is associated with the first operating parameter;
- a third magnetic control, wherein operation of the third magnetic control activates/deactivates a third operating parameter;
- wherein each of the first rotatable magnetic control, the second rotatable magnetic control, and the third magnetic control are secured to the cover of the industrial enclosure without penetrating an interior wall of the cover, and are in close proximity to one another;
- one or more magnetic field sensors within the industrial enclosure to sense one or more characteristics of the first rotatable magnetic control, the second rotatable magnetic control, and the third magnetic control, and to generate one or more signals representative of the sensed one or more characteristics; and
- a controller that receives the one or more signals and identifies each of the first rotatable magnetic control, the second rotatable magnetic control, and the third magnetic control from the one or more signals,
- wherein the close proximity of the first rotatable magnetic control, the second rotatable magnetic control, and the third magnetic control enables detection of the respective characteristic of each of the first rotatable magnetic control, the second rotatable magnetic control, and the third magnetic control without interference by the respective characteristic of the others of the first rotatable magnetic control, the second rotatable magnetic control, and the third magnetic control.

* * * * *